United States Patent [19]
Sato et al.

[11] Patent Number: 5,164,335
[45] Date of Patent: Nov. 17, 1992

[54] SEMICONDUCTOR MANUFACTURING APPARATUS AND METHOD OF MANUFACTURING SEMICONDUCTOR DEVICE

[75] Inventors: Mitsuo Sato, Zama; Hazime Shaura; Megumi Tateishi, both of Yokohama, all of Japan

[73] Assignee: Kabushiki Kaisha Toshiba, Kawasaki, Japan

[21] Appl. No.: 713,084

[22] Filed: Jun. 11, 1991

[30] Foreign Application Priority Data

Jun. 14, 1990 [JP] Japan .................................. 2-155781

[51] Int. Cl.$^5$ ......................................... H01L 21/449
[52] U.S. Cl. .................................. 437/212; 437/209; 437/211; 29/25.01
[58] Field of Search ............... 437/212, 211, 217, 209, 437/207; 29/25.01, 25.02, 25.03

[56] References Cited

U.S. PATENT DOCUMENTS

| 4,724,325 | 2/1988 | Armstrong et al. | |
|---|---|---|---|
| 4,826,556 | 5/1989 | Kobayashi | |
| 4,868,490 | 9/1989 | Blumenthal | 29/25.01 |
| 4,903,754 | 2/1990 | Hirscher et al. | 29/25.01 |
| 4,904,610 | 2/1990 | Shyr | 437/209 |
| 4,942,139 | 7/1990 | Korwin-Pawlowski | 437/209 |

FOREIGN PATENT DOCUMENTS

| 0273703 | 12/1988 | European Pat. Off. | |
|---|---|---|---|
| 54-34774 | 3/1979 | Japan | 29/25.01 |
| 58-212125 | 12/1983 | Japan | 29/25.01 |

Primary Examiner—Brian E. Hearn
Assistant Examiner—Kevin M. Picardat
Attorney, Agent, or Firm—Finnegan, Henderson, Farabow, Garrett and Dunner

[57] ABSTRACT

The present invention discloses a semiconductor manufacturing apparatus comprising a wafer supply unit including a tray on which a plurality of wafers are placed, a positioning unit for detecting specific points on the wafers prior to molding of a resin and compensating for the position of the wafers, a molding unit for molding the resin on the peripheries of the wafers which have been compensated for position, an injecting unit for supplying the resin to the molding unit, a storage unit for storing resin-molded wafers, a wafer carrying unit for carrying wafers between the supply unit and the positioning unit, between the positioning unit and the molding unit and between the molding unit and the storage unit, and a control unit for controlling the operation of the supply unit, the positioning unit, the molding unit, the injecting unit, the storage unit and the carrying unit.

5 Claims, 9 Drawing Sheets

SEMICONDUCTOR MANUFACTURING APPARATUS AND METHOD OF MANUFACTURING SEMICONDUCTOR DEVICE

BACKGROUND OF THE INVENTION

1. Field of the Invention

The present invention relates to a semiconductor manufacturing apparatus and a method of manufacturing a semiconductor device.

2. Description of the Related Art

One of methods of molding or forming a resin on the periphery of the wafer of a semiconductor device in process, such as a rectifier element, is disclosed in Japanese Unexamined Patent Publication No. 63- 141370. In order to employ the resultant form of the resin for positioning the assembly in subsequent processes, a semiconductor manufacturing apparatus and a resin molding method has been proposed recently which form a resin on the periphery of a wafer using a die assembly.

Hereinafter a conventional semiconductor manufacturing apparatus and resin molding method for molding resin on the periphery of a wafer using a die assembly will be described. FIG. 1 illustrates a semiconductor device in process, FIG. 2 illustrates a conventional semiconductor manufacturing apparatus, and FIG. 3 illustrates a position alignment gauge for wafer.

The conventional semiconductor manufacturing apparatus, as shown in FIG. 2, is constructed from a molding unit 1, a resin injecting unit 2 and a control unit 4 provided in a frame 3. The molding unit 1 comprises an upper mold 5 and a lower mold 6 which face each other vertically. The die assembly comprised of the upper mold 5 and the lower mold 6 is maintained at a given temperature at the time of molding of resin in order to solidify it.

In such an apparatus, when a wafer 7 is placed on the lower mold 6, the upper mold 5 travels to the lower mold 6 under the control of the control unit 4, thereby closing the die assembly. At this point, a ring-like cavity into which resin is injected is formed between the periphery of the wafer 7 and the lower mold 6. After the closing of the die assembly, the resin injecting unit 2 travels in the direction of the molding unit 1, so that its discharge nozzle 8 hits against the die assembly. Resin is subsequently injected from the discharge nozzle into the ring-like cavity formed within the die assembly through an inlet (not shown) of the die assembly. After the resin has been solidified, the wafer 7 is taken out of the lower mold 6. As a result, a ring-like resin 9 is formed on the periphery of the wafer 7 as shown in FIG. 1.

The resin thus formed is employed as an insulator or a protective film when the wafer 7 is incorporated into a semiconductor device. However, insulation deterioration is liable to occur when the width H from the edge of the wafer 7 to the periphery of the resin 9 is short. If, therefore, misalignment of the center of the wafer 9 with the center of the ring-like resin 9 should occur, a portion of a very small width H would be produced. Namely, it is required to bring the center of the wafer 7 and the center of the ring-like resin 9 in exact alignment with each other.

To this end, such a position alignment gauge 10 as shown in FIG. 3 is used. That is, the position alignment gauge 10 is formed such that it is circle in shape and its outside diameter and inside diameter are equal to the outside diameter of the lower mold 6 and the diameter of the wafer 7, respectively. Thus, when the wafer 7 is loaded into the positioning gauge 10 with the aid of a pincette or the like, the center of the wafer 7 and the center of the gauge 10 are brought in alignment with each other. Here a vacuum chuck 12 having inside diameter equal to the outside diameter of the position alignment gauge 10 is engaged with the gauge 10. After the wafer 7 is attracted to the vacuum chuck 12 by the use of vacuum force, the position alignment gauge 10 is removed. The vacuum chuck 12 is moved onto the lower mold 6 and then engaged with it. Subsequently the operation of the vacuum chuck is stopped with the result that the wafer 7 is placed in position on the lower mold 6. That is, the wafer 7 is consequently placed on the lower mold 6 with their centers aligned with each other.

With the conventional method, as described above, the wafer is treated manually by a worker and taking of the wafer out of the mold after the formation of the resin is also performed manually by the worker. That is, with the conventional method of molding or forming a resin, since the process of placing the wafer on the mold is performed by hand using the vacuum chuck 12, the worker has to be very careful to prevent breakage of the wafer which is liable to occur when it is placed and removed. Thus, this process takes a long time. The position alignment gauge 10, as described above, uses the periphery of the wafer 7 as its reference. Actually even wafers which are considered to be equal to one another in diameter certainly have a tolerance depending on the accuracy of processing. For this reason, even if the position alignment gauge 10 is used, misalignment of the center of the wafer 7 with the center of the lower mold 6 may occur due to the above-mentioned tolerance when the wafer 7 is placed on the lower mold 6. It is thus difficult to secure the accuracy of a resin pattern with respect to the center of the wafer 7 and to control the difference in quality between workers.

The vacuum chuck 12 as shown in FIG. 3 is used for taking the wafer 7 out of the mold after the resin has been formed and the resin used is a material having high adhesive property. For this reason, even if a material which is difficult for the resin to adhere to is used for the upper and lower molds 5 and 6, it is difficult to release the wafer 7 from the mold smoothly by vacuum force only. Furthermore, the work for taking the wafer 7 out of the mold by hand using the vacuum chuck 12 requires a long time and reduces productivity because a worker becomes careful to prevent wafer breakage which is liable to occur in taking out the wafer and moreover the release of the wafer from the mold is difficult. The wafer 7 may be broken due to a mistake made in taking out it, reducing yield. Moreover, forcible taking out of wafer 7 may produce microcracks within the wafer, thus adversely affecting the quality and reliability of a semiconductor device.

There is also another wafer releasing method which pushes up the under surface of wafer 7 mechanically with a pin. This method has a drawback that wafer 7 is liable to break because of a load imposed on the wafer. Being soft, the resin cannot be pushed up with a pin.

As described above, the conventional method has a drawback that the process of placing a wafer on the lower mold requires time. Moreover, there is another drawback that the accuracy of a resin pattern with respect to the center of a wafer is difficult to increase. Furthermore, there is still another drawback that, since a resin used is highly adhesive, a wafer cannot be released from the die assembly smoothly, requiring time and breaking the wafer by mistake. With the method which pushes the under surface of a wafer up with a pin, on the other hand, there is a drawback that the wafer is liable to break because of pushing load imposed on the wafer.

SUMMARY OF THE INVENTION

It is accordingly an object of the present invention to provide a semiconductor manufacturing apparatus and method which permit automatic positioning of wafers to be performed and yield and productivity to be improved by carrying wafers automatically and taking resin-molded products out of a die assembly smoothly.

To attain the above object, a semiconductor manufacturing apparatus of the present invention comprises: wafer supply means on which a plurality of wafers are placed; positioning means for detecting specific points on wafers prior to molding of a resin and compensating for the position of the wafers; molding means for molding the resin on the peripheries of the position-compensated wafers; injecting means for supplying the resin to said molding means; storage means for storing resin-molded wafers; wafer carrying means between said supply means and said positioning means, between said positioning means and said molding means and between said molding means and said storage means; and control means for controlling the operation of said supplying means, positioning means, said molding means, said injecting means, said storage means and said carrying means.

Said molding means has a die assembly for molding the resin on the periphery of the wafer, and said die assembly has a nozzle for blowing high-pressure air for releasing a resin-molded wafer from said die assembly.

A semiconductor manufacturing method of the present invention releases the wafers from the die assembly by blowing high-pressure air to a surface of each of the wafers after the resin is molded on the peripheries of the wafer and takes the released samples out of the die assembly.

According to such a construction, specific points of a wafer can be detected by the positioning means. Thus, misalignment of the center of the resin with the center of a wafer, which may arise from a tolerance on diameter of wafers, can be prevented. By controlling the operation of individual units by the control means, automation of the manufacturing apparatus can be achieved, thereby decreasing a burden imposed on a worker and improving yield and production.

The use of high-pressure air permits the resin-molded products to be taken out of the die assembly smoothly in comparison with the case in which they are take out by hand with the aid of a vacuum chuck or the like, thereby improving productivity, yield and reliability.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Hereinafter an embodiment of the present invention will be described with reference to the drawings.

Figure 1:
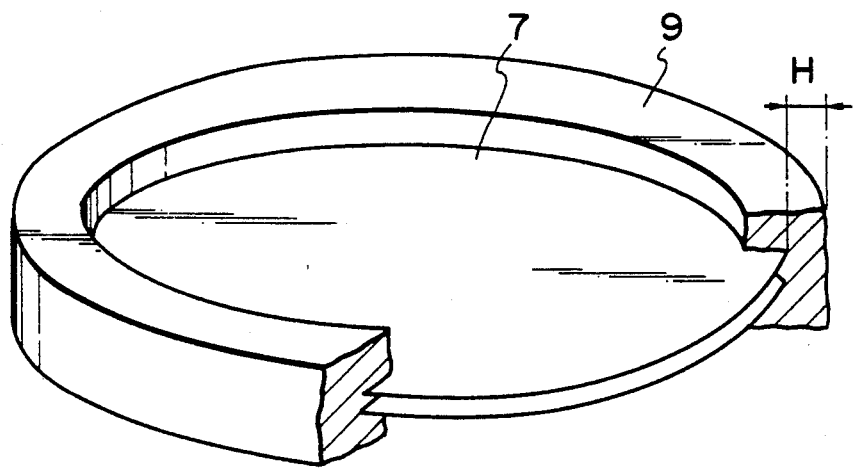
FIG. 1 is an exterior view of a semiconductor device in process.
Figure 2:
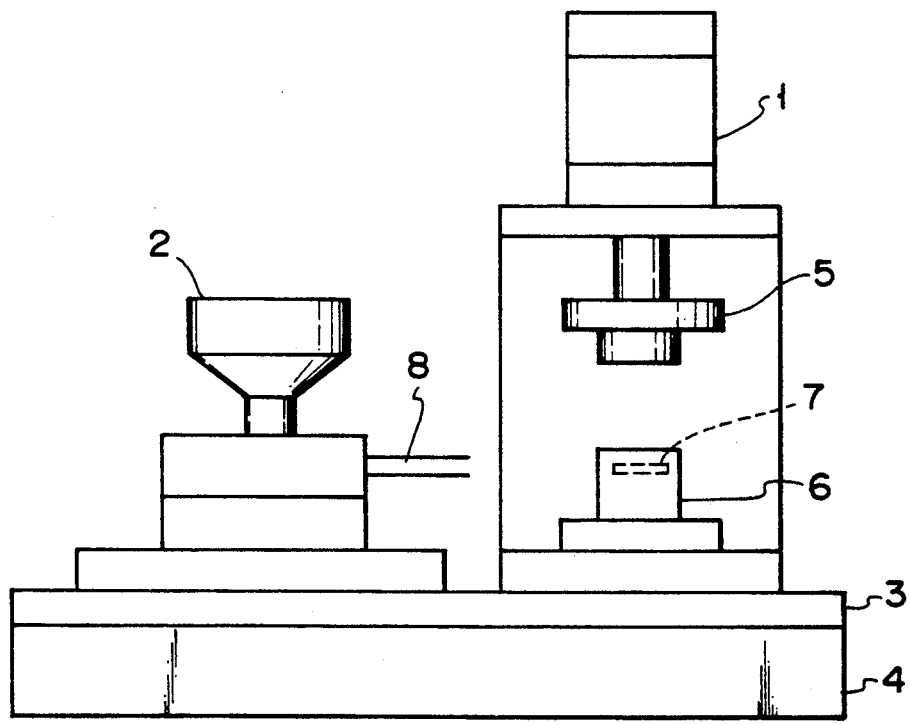
FIG. 2 is a schematic illustration of a conventional semiconductor manufacturing apparatus.
Figure 3:
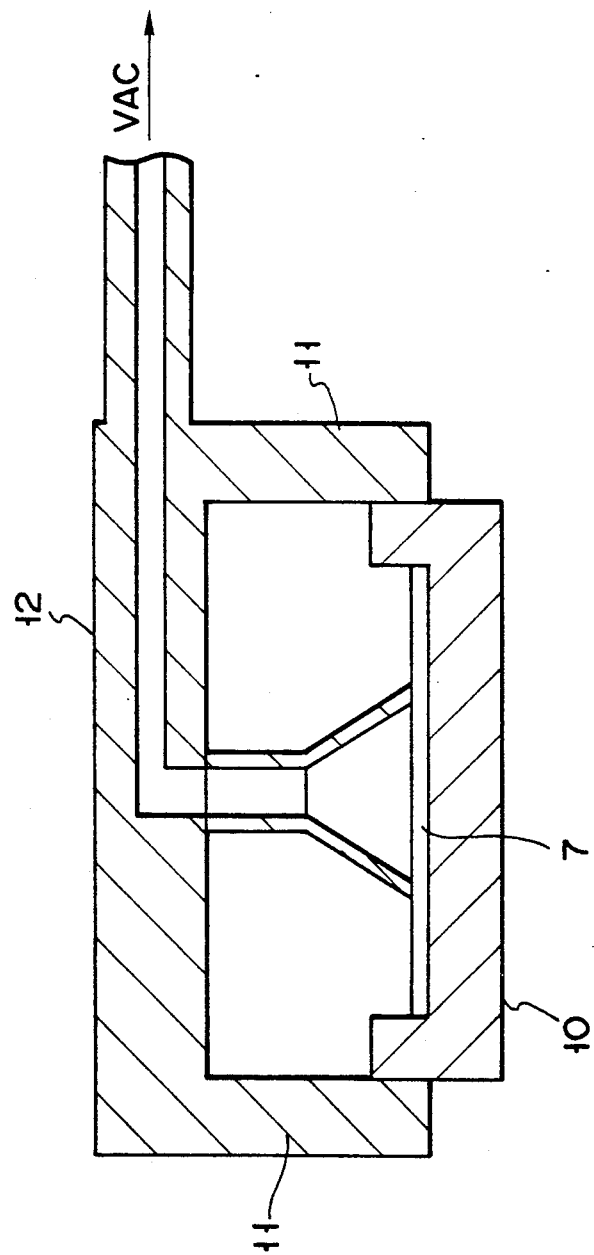
FIG. 3 is a schematic illustration of a conventional wafer position alignment gauge.
Figure 4:
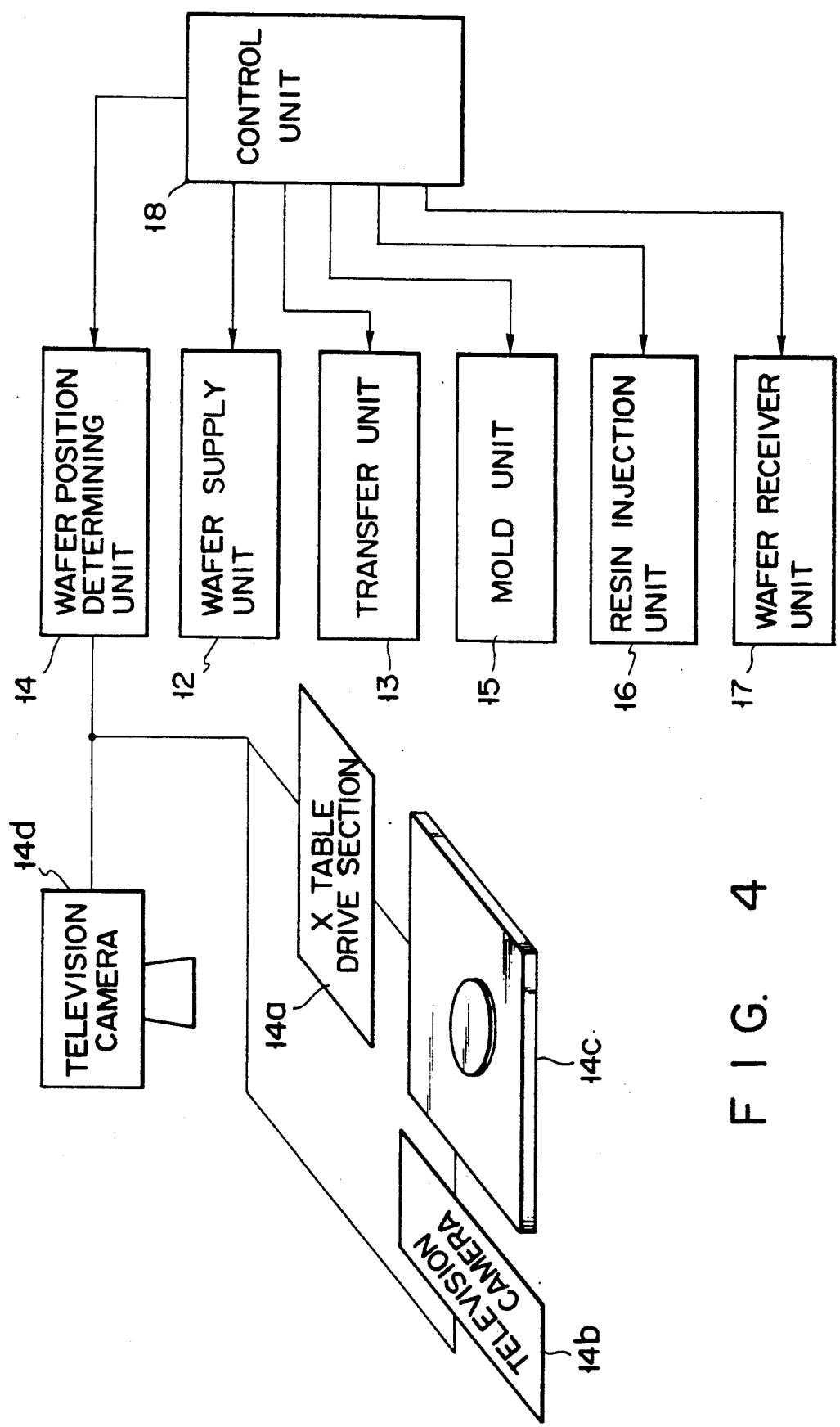
FIG. 4 is a control block diagram of a semiconductor manufacturing apparatus according to an embodiment of the present invention.
Figure 5:
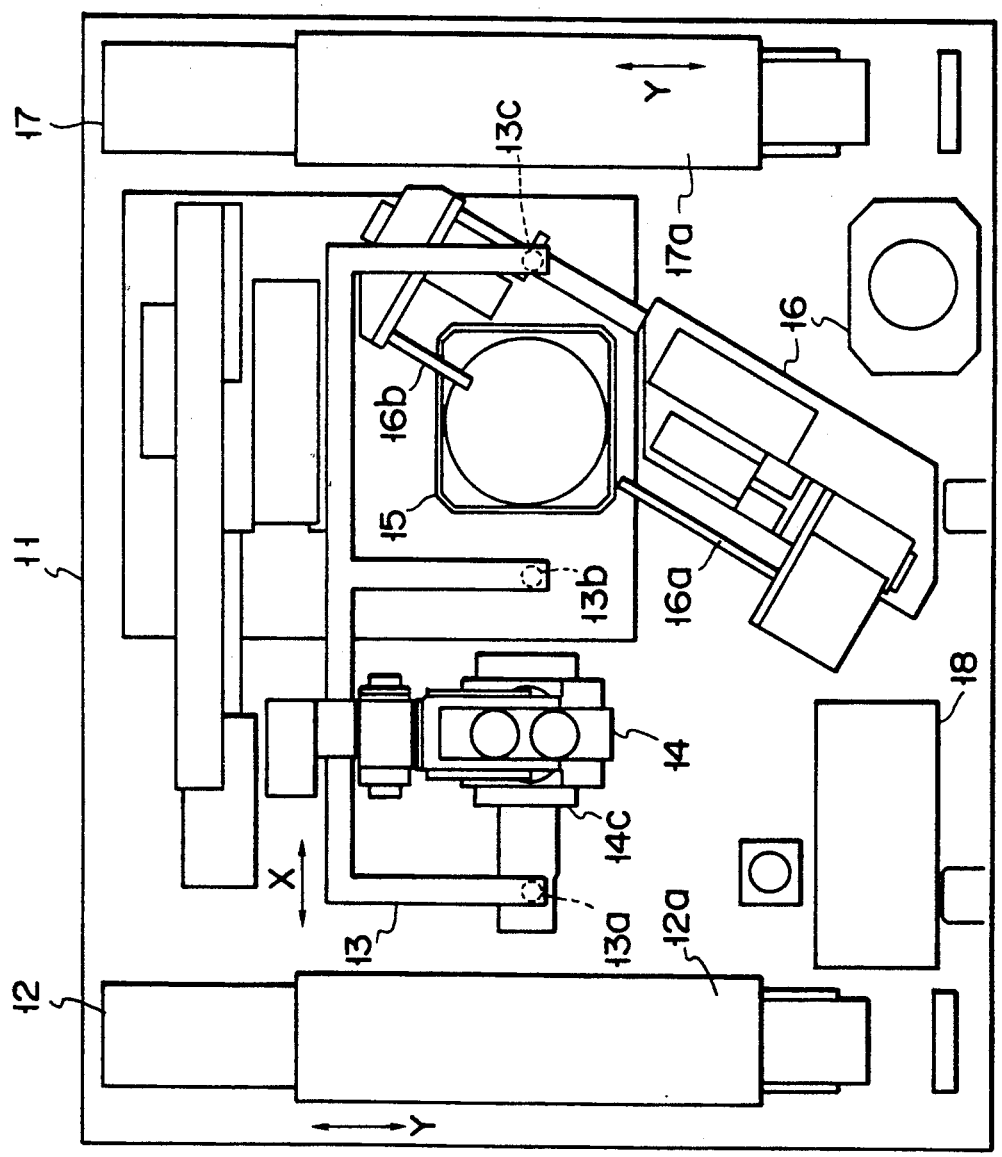
FIG. 5 is a plan view of a semiconductor manufacturing device according to an embodiment of the present invention.
Figure 6:
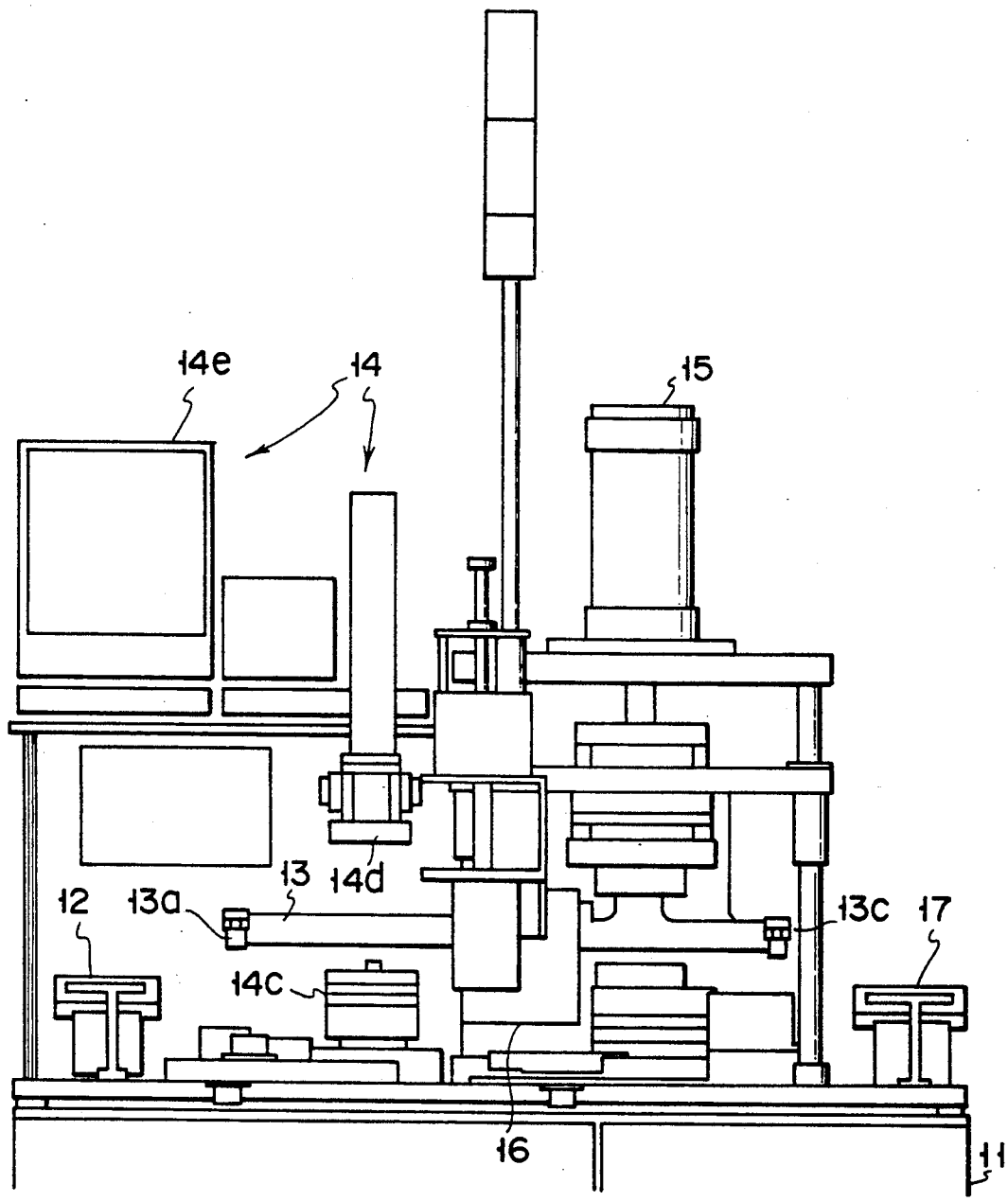
FIG. 6 is a front view of a semiconductor manufacturing apparatus according to an embodiment of the present invention.
Figure 7:
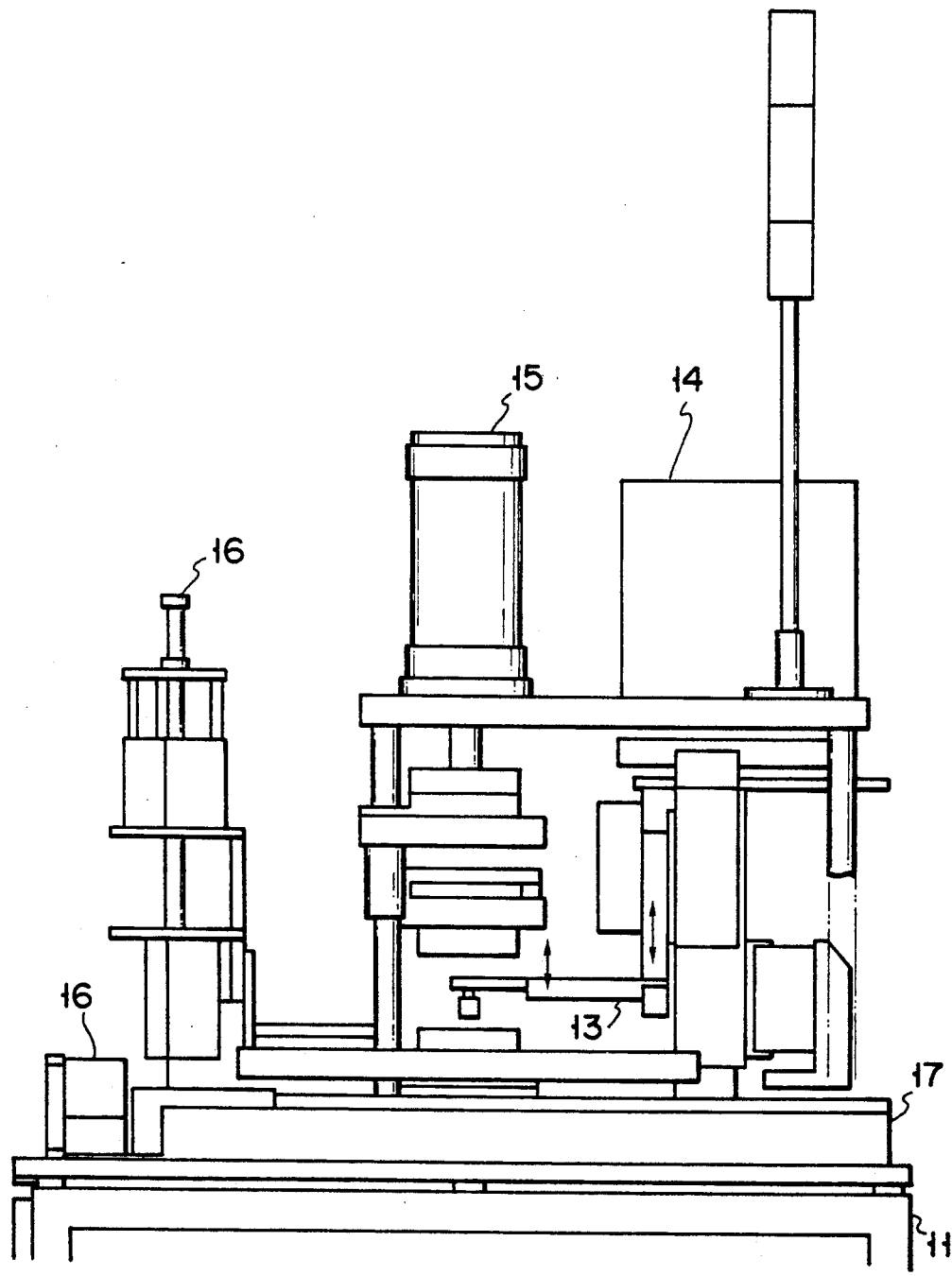
FIG. 7 is a side view of a semiconductor manufacturing apparatus according to an embodiment of the present invention.

In the drawings, FIG. 4 is a control block diagram of a semiconductor manufacturing apparatus according to an embodiment of the present invention; FIG. 5 is a plan view of a semiconductor manufacturing device according to an embodiment of the present invention; FIG. 6 is a front view of a semiconductor manufacturing apparatus according to an embodiment of the present invention; and FIG. 7 is a side view of a semiconductor manufacturing apparatus according to an embodiment of the present invention.

On a frame 11 there are placed in position a wafer supply unit (supply means) 12, a wafer carrying unit (carrying means) 13, a positioning unit (positioning means) 14, a molding unit (molding means) 15, a resin injecting unit (injecting means) 16 and a wafer storage unit (storage means) 17. These units 12 to 17 are controlled by a control unit (control means) 18.

The wafer supply unit 12 is equipped with a stage 12a movable in the Y direction. A tray is placed on the stage 12a. On the tray are disposed a plurality of wafers prior to the formation of a resin at equal intervals. The wafer carrying unit 13 is provided, at it ends, with vacuum chucks 13a to 13c which are moved conjointly in the X direction. The positioning unit 14 is constructed from an XY table having an X table driving unit 14a and a Y table driving unit 14b, a television camera 14d and a television monitor 14e for displaying information from the television camera. The molding unit 15 comprises a die assembly having a die closing mechanism and a temperature controller. The resin injecting unit 16 is provided with a resin inject nozzle 16a for injecting a resin and a recovery nozzle 16b for extracting air and recovering extra resin. The wafer storage unit 17 is provided with a stage 17a movable in the Y direction, on which a tray is placed. A plurality of resin-molded wafers are stored at equal intervals on the tray.

Figure 8:
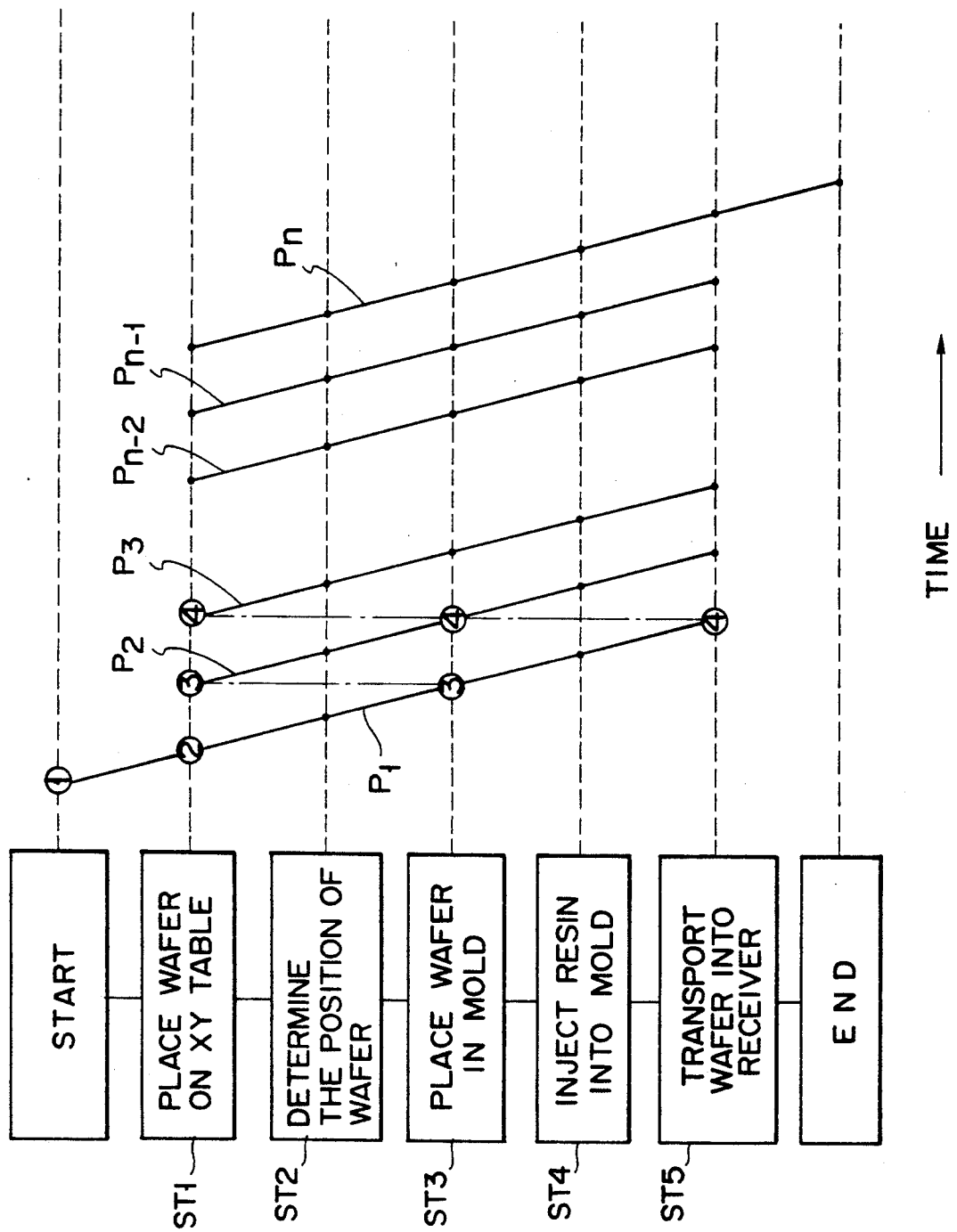
FIG. 8 is a flowchart illustrating the operation of a semiconductor manufacturing apparatus according to an embodiment of the present invention.

Next, processes P1 to Pn for each wafer and the operation of the semiconductor manufacturing apparatus will be described with reference to FIG. 8.

First, the tray on which a plurality of wafers before molding are placed at equal intervals is placed on the stage 12a. Subsequently, the vacuum chuck 13a at the end of the wafer carrying unit 13 is moved onto the tray to attract a wafer by means of vacuum force. The wafer is carried to the positioning unit 14 and then placed on the XY table 14c of the positioning unit 14 (step ST1, process P1(1), (2)). Next, the wafer placed on the XY table 14c is detected by the television camera 14d, so that specific points of the wafer are calculated by the control unit 18. For example, three predetermined points on a wafer are detected, and the wafer is assumed to be properly placed on the XY table if deviations of the three points on the wafer from the optical axis of the lens of the television camera 14d take predetermined values. When the wafer is not properly placed on the XY table, the XY table 14c is driven by the X table driving unit 14a and the Y table driving unit 14b so as to detect the specific points of the wafer for positioning (step ST2, process P1). Here the specific points are referred to as points decided on a wafer so as to make a positioning error with respect to a reference point zero in positioning the wafer on the positioning unit 14, the reference point being a point at which the optical axis of the lens of the television camera and the central point of the XY table 14c coincide with each other and stored previously in the control unit 18.

Next, the vacuum chuck 13b provided at the end of the wafer carrying unit 13 is moved onto the XY table 14c to attract the wafer subjected to positioning control by means of vacuum force. The wafer is carried to the die assembly of the molding unit 15 and then placed in position on the lower mold (step ST3, process P1(3)). At this point, a wafer on the tray is attracted by the vacuum chuck 13a of the wafer carrying unit 13 by means of vacuum force and then placed on the XY table 14c of the positioning unit 14 (step ST1, process P2(3)). Subsequently, the upper mold of the die assembly is brought down to close the die assembly. A resin is injected by the resin injecting unit 16 into the die assembly through the injection nozzle 16a. After being injected, the resin is solidified by being heated for a given time (step ST4, process P1). Subsequently, the upper mold of the die assembly is raised after the solidification of the resin. The vacuum chuck 13c of the wafer carrying unit 13 is moved onto the lower mold to attract the resin-molded wafer by means of vacuum force. The wafer is then carried to the wafer storage unit 17, so that it is stored in a predetermined position on the tray of the wafer storage unit 17 (step ST5, process P1(4)). At the same time, a wafer on the XY table 14c is placed on the lower mold by the vacuum chuck 13b of the wafer carrying unit 13 (step ST3, process P2(4)), and a wafer on the wafer supply unit 12 is placed on the XY table 14c by the vacuum chuck 13a of the wafer carrying unit 13 (step STI, process P3(4)).

Thereby, the process P1 for the first wafer is completed. This operation is performed automatically and successively by the control unit 18 until the process Pn for the last nth wafer is completed.

With such a configuration, the positioning method is changed from the conventional mechanical positioning using the periphery of a wafer as a reference to automatic positioning. This can prevent misalignment of the center of the ring-like resin with the center of a wafer which may arise from a tolerance on diameter of wafers. Therefore, variations in quality can be eliminated and moreover the yield of products can be maintained or further improved. The conventional complex work required of workers is automated. Thereby, the burden imposed on workers can be alleviated and production which varies with the ability of individual workers can be increased uniformly.

Figure 9:
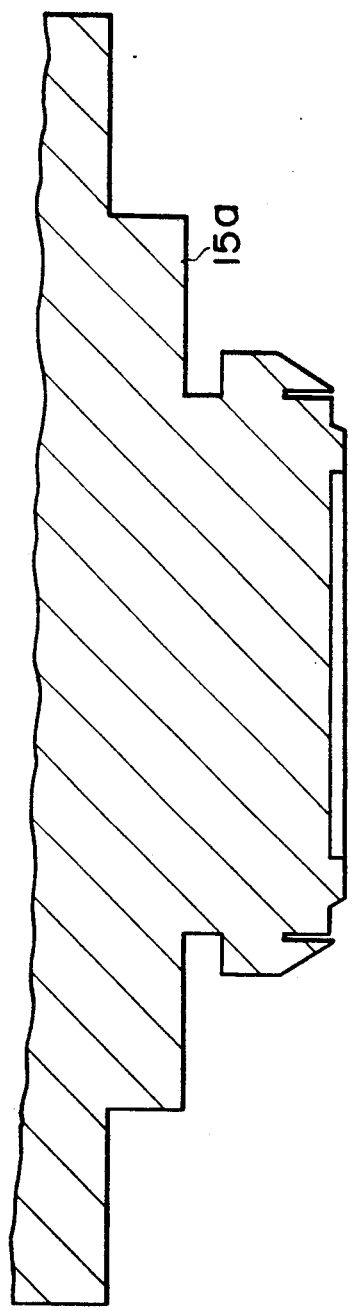
FIGS. 9 and 10 are sectional views of dies of a molding unit constituting a semiconductor manufacturing apparatus according to an embodiment of the present invention.
Figure 10:
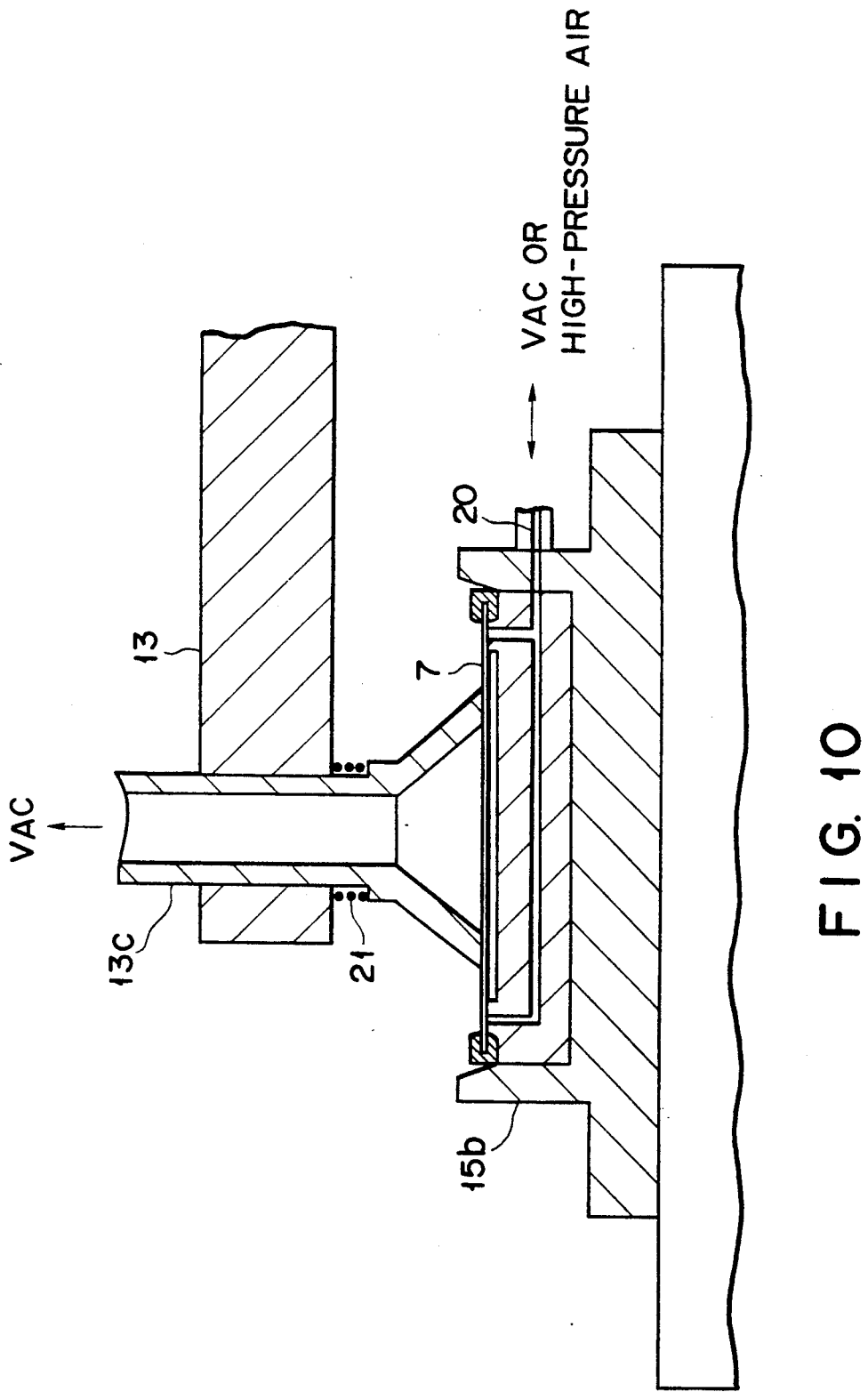

FIGS. 9 and 10 illustrate the upper mold 15a and the lower mold 15b, respectively, of the molding unit 15 of the above semiconductor manufacturing apparatus.

The die assembly composed of the upper mold 15a and the lower mold 15b is maintained by the control unit 4 at a given temperature in order to solidify the resin at the time of molding. The lower mold 5b is designed such that the wafer 7 can be placed on it. A ring-like cavity into which resin is injected is formed in the periphery of the wafer 7 placed on the lower mold 15b. Since the center of the wafer 7 is positioned by the positioning unit 14, the wafer 7 can be placed on the lower mold 15b with the center of the wafer and the center of the lower mold aligned with each other. Furthermore, the lower mold 15b is equipped with a nozzle 20 for blowing high-pressure air to the under surface of the wafer 7 to release it from the die assembly. The nozzle 20 may be used as a suction pipe for fixing the wafer 7 prior to molding provisionally by vacuum force.

Next, a method of releasing resin-molded wafers from the die assembly will be described with reference to FIGS. 9 and 10.

After the resin has been molded, the upper mold 15a is raised and the vacuum chuck 13c provided at the end of the wafer carrying unit 13 is disposed in the neighborhood of the top surface of the wafer 7. In this case it does not matter even if the vacuum chuck comes into contact with the wafer. Subsequently high-pressure air is blown from the nozzle 20 provided at the lower mold 15b to the under surface of the wafer 7, thereby releasing the wafer from the die assembly. For better releasability it is desired that high-pressure air be blown intermittently. It is to be noted here that no problems will be encountered even if high-pressure air is blown to the under surface of the wafer, because the vacuum chuck 13c is disposed in the neighborhood of the wafer and moreover a shock that the wafer experiences when it is released is absorbed by a spring 21 of the vacuum chuck 13c. Subsequently, the wafer which has been released from the die assembly is taken out of the die assembly by being attracted by the vacuum chuck (holding means) 13c and then carried to the wafer storage unit 17. According to such a method of taking out resin-molded wafers, productivity, yield and reliability can be increased in comparison with the case of taking out them by hand.

As described above, the semiconductor manufacturing apparatus and manufacturing method according to the present invention have the following advantages.

By positioning a wafer automatically, it becomes possible to prevent misalignment of the center of resin formed in the form of a ring with the center of the wafer, which arises from a tolerance on diameter of wafers. Since a series of processes are automated, a burden imposed on a worker can be decreased and yield and production can be increased. The use of high-pressure air allows resin-molded wafers to be taken out of the die assembly smoothly in comparison with the case where the resin-molded wafers are taken out manually with the aid of a vacuum chuck or the like, thereby increasing productivity, yield and reliability of semiconductor products.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A method of manufacturing a semiconductor device comprising the steps of:

placing a plurality of wafers on wafer supplying means;

carrying said wafers to positioning means;

detecting specific points on said wafers prior to formation of a resin for compensating the position of said wafers by said positioning means;

supplying, after said position-compensated wafers are placed in position on resin molding means, a resin to the peripheries of said wafers by supplying means;

forming said resin on the peripheries of said wafers; and carrying resin-molded wafers to storage means.

2. The method according to claim 1, further comprising, between the step of molding said resin and the step of carrying said wafers to said storage means, the steps of releasing said wafers from said molding means while blowing high-pressure air to a surface of each of said wafers and of taking said released wafers out of said molding means by holding means.

3. A semiconductor manufacturing apparatus comprising:

sample supply means on which a plurality of wafers are placed;

positioning means for detecting specific points on wafers prior to molding of a resin and compensating for the position of the wafers;

molding means for molding the resin on the peripheries of the position-compensated wafers;

injecting means for supplying the resin to said molding means;

storage means for storing resin-molded wafers;

sample carrying means between said supply means and said positioning means, between said positioning means and said molding means and between said molding means and said storage means; and control means for controlling the operation of said supplying means, positioning means, said molding means, said injecting means, said storage means and said carrying means.

4. The semiconductor manufacturing apparatus according to claim 3, in which said molding means has a die assembly for molding the resin on the periphery of the wafer, said die assembly having a nozzle for blowing high-pressure air for releasing a resin-molded wafer from said die assembly.

5. The semiconductor manufacturing apparatus according to claim 3, in which said positioning means comprises an XY table on which a wafer is placed, a television camera for detecting the position of the wafer and transmitting information on the position of the wafer to said control means, X table driving means and Y table driving means for moving said XY table in the X direction and Y direction, respectively, and a television monitor for visually displaying information from said television camera.

* * * * *